(12) United States Patent
Huang et al.

(10) Patent No.: US 10,431,549 B2
(45) Date of Patent: Oct. 1, 2019

(54) SEMICONDUCTOR PACKAGE AND MANUFACTURING METHOD THEREOF

(71) Applicant: Powertech Technology Inc., Hsinchu County (TW)

(72) Inventors: Chien-Wen Huang, Hsinchu County (TW); Chia-Wei Chiang, Hsinchu County (TW); Wen-Jeng Fan, Hsinchu County (TW); Li-Chih Fang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/867,670

(22) Filed: Jan. 10, 2018

(65) Prior Publication Data

US 2019/0214347 A1 Jul. 11, 2019

(51) Int. Cl.
*H01L 23/495* (2006.01)
*H01L 23/538* (2006.01)
(Continued)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/561* (2013.01); *H01L 21/565* (2013.01); *H01L 21/568* (2013.01); *H01L 21/78* (2013.01); *H01L 23/3114* (2013.01); *H01L 23/5383* (2013.01);
(Continued)

(58) Field of Classification Search
CPC ............. H01L 23/5389; H01L 23/3114; H01L 23/5386

USPC .......................................................... 257/686
See application file for complete search history.

(56) References Cited

U.S. PATENT DOCUMENTS

| 8,115,292 B2 * | 2/2012 | Toh .................... H01L 21/486 257/686 |
| 9,449,953 B1 | 9/2016 | Shih et al. |
| 9,496,196 B2 | 11/2016 | Yu et al. |
| 9,728,498 B2 * | 8/2017 | Su ..................... H01L 25/105 |

(Continued)

FOREIGN PATENT DOCUMENTS

| CN | 106486459 | 3/2017 |
| TW | I351089 | 10/2011 |

OTHER PUBLICATIONS

"Office Action of Taiwan Counterpart Application," dated Mar. 7, 2019, p. 1-p. 6.

*Primary Examiner* — Nitin Parekh
(74) *Attorney, Agent, or Firm* — JCIPRNET (57) ABSTRACT

A semiconductor package including a stacked-die structure, a second encapsulant laterally encapsulating the stacked-die structure and a redistribution layer disposed on the second encapsulant and the staked-die structure is provided. The stacked-die structure includes a first semiconductor die including a first active surface, a circuit layer disposed on the first active surface, a second semiconductor die including a second active surface facing towards the first active surface, a plurality of conductive features distributed at the circuit layer and electrically connected to the first and second semiconductor die and a first encapsulant encapsulating the second semiconductor die and the conductive features. A portion of the conductive features surrounds the second semiconductor die. The redistribution layer is electrically connected to the staked-die structure. A manufacturing method of a semiconductor package is also provided.

9 Claims, 11 Drawing Sheets

(51) Int. Cl.
*H01L 25/065* (2006.01)
*H01L 25/00* (2006.01)
*H01L 23/00* (2006.01)
*H01L 23/31* (2006.01)
*H01L 21/56* (2006.01)
*H01L 21/48* (2006.01)
*H01L 21/78* (2006.01)
*H01L 25/10* (2006.01)

(52) U.S. Cl.
CPC ...... *H01L 23/5384* (2013.01); *H01L 23/5386* (2013.01); *H01L 24/19* (2013.01); *H01L 24/20* (2013.01); *H01L 24/96* (2013.01); *H01L 25/0657* (2013.01); *H01L 25/105* (2013.01); *H01L 25/50* (2013.01); *H01L 2224/214* (2013.01); *H01L 2224/95001* (2013.01); *H01L 2225/06513* (2013.01); *H01L 2225/06548* (2013.01); *H01L 2225/06558* (2013.01); *H01L 2225/06586* (2013.01); *H01L 2225/1035* (2013.01); *H01L 2225/1058* (2013.01)

(56) References Cited

U.S. PATENT DOCUMENTS

| | | | |
|---|---|---|---|
| 9,837,359 B1* | 12/2017 | Chiu | H01L 23/5389 |
| 2007/0126127 A1* | 6/2007 | Jobetto | H01L 21/568 |
| | | | 257/780 |
| 2010/0102428 A1* | 4/2010 | Lee | H01L 23/481 |
| | | | 257/686 |
| 2012/0018895 A1* | 1/2012 | Oganesian | H01L 23/481 |
| | | | 257/773 |
| 2014/0360765 A1* | 12/2014 | Kiwanami | H05K 1/185 |
| | | | 174/260 |
| 2015/0091149 A1* | 4/2015 | Jang | H01L 23/3128 |
| | | | 257/686 |
| 2015/0235915 A1* | 8/2015 | Liang | H01L 23/145 |
| | | | 361/764 |
| 2016/0049385 A1* | 2/2016 | Yu | H01L 23/481 |
| | | | 257/774 |
| 2016/0190107 A1* | 6/2016 | Meyer | H01L 23/31 |
| | | | 257/686 |
| 2017/0033079 A1 | 2/2017 | Lin et al. | |
| 2018/0047674 A1* | 2/2018 | Tsai | H01L 23/5383 |
| 2018/0061813 A1* | 3/2018 | Hsieh | H01L 23/28 |

* cited by examiner

SEMICONDUCTOR PACKAGE AND MANUFACTURING METHOD THEREOF

BACKGROUND OF THE INVENTION

1. Field of the Invention

The present invention generally relates to a package structure and a manufacturing method thereof; and more particularly, to a semiconductor package and a manufacturing method thereof.

2. Description of Related Art

In recently years, electronic apparatus are more important for human's life. In order for electronic apparatus design to achieve being light, slim, short, and small, semiconductor packaging technology has kept progressing, in attempt to develop products that are smaller in volume, lighter in weight, higher in integration, and more competitive in market. Since the chip package technique is highly influenced by the development of integrated circuits, therefore, as the size of electronics has become demanding, so does the package technique. As such, miniaturizing the semiconductor package while maintaining the process simplicity has become a challenge to researchers in the field.

SUMMARY OF THE INVENTION

The disclosure provides a semiconductor package and a manufacturing method thereof; which is helpful to miniaturization design.

The disclosure provides a semiconductor package including a stacked-die structure, a second encapsulant and a redistribution layer. The stacked-die structure includes a first semiconductor die, a circuit layer, a second semiconductor die, a plurality of conductive features and a first encapsulant. The first semiconductor die includes a first active surface. The circuit layer is disposed on the first active surface of the first semiconductor die. The second semiconductor die is electrically connected to the first semiconductor die through the circuit layer. The second semiconductor die includes a second active surface facing towards the first active surface of the first semiconductor die. The conductive features are distributed at the circuit layer. The conductive features are electrically connected to the first semiconductor die and the second semiconductor die. A portion of the conductive features surrounds the second semiconductor die. The first encapsulant encapsulates the second semiconductor die and the conductive features. The second encapsulant laterally encapsulates the stacked-die structure. The redistribution layer is disposed on the second encapsulant and the staked-die structure. The redistribution layer is electrically connected to the staked-die structure.

The disclosure provides a semiconductor package including a first semiconductor die, a second semiconductor die, a plurality of conductive features, a first encapsulant, a second encapsulant and a redistribution layer. The first semiconductor die includes a first active surface. The second semiconductor die is electrically connected to the first semiconductor die and includes a second active surface facing towards the first active surface of the first semiconductor die. The second semiconductor die partially covers the first semiconductor die. The conductive features are distributed at the first active surface of the first semiconductor die and surrounding the second semiconductor die. The conductive features are electrically connected to the first semiconductor die and the second semiconductor die. The first encapsulant encapsulates the second semiconductor die and the conductive features. The second encapsulant laterally encapsulates the first encapsulant and the first semiconductor die. The redistribution layer is disposed on the second encapsulant and the first encapsulant. The redistribution layer is electrically connected to the first semiconductor die and the second semiconductor die through the conductive features.

The disclosure provides a manufacturing method of a package structure. The method includes at least the following steps. A plurality of conductive features are formed on a first active surface of a first semiconductor die. The first semiconductor die is electrically connected to the conductive features. A second semiconductor die is disposed on the first semiconductor die. The second semiconductor die includes a second active surface facing towards the first active surface of the first semiconductor die. The second semiconductor die is electrically connected to the first semiconductor die. The second semiconductor die and the conductive features are encapsulated by a first encapsulant. The first encapsulant and the first semiconductor die are laterally encapsulating by a second encapsulant. At least a portion of the conductive features is exposed by the first encapsulant and the second encapsulant. A redistribution layer is formed on the second encapsulant. The redistribution layer is electrically connected to the first semiconductor die and the second semiconductor die through the conductive features.

Based on the above, the semiconductor package including the stacked-die structure may provide multi-functions in a single package to reduce the fabrication cost and the packaging volume. Moreover, since the first semiconductor die and the second semiconductor die are disposed in a face-to-face configuration, the signal transmission path is shortened to improve the efficiency and the integration is greatly enhanced. In addition, the first encapsulant and the second encapsulant may provide the rigidity of the overall structure so as to prevent the semiconductor package from being damaged.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
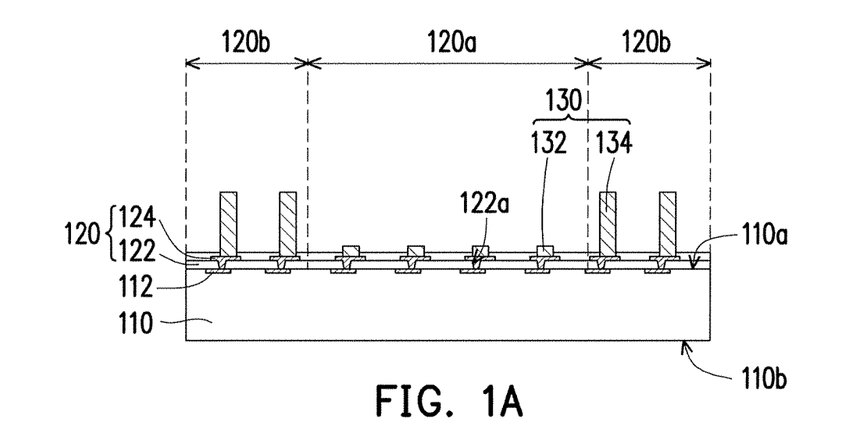
FIG. 1A to FIG. 1I are schematic cross-sectional views illustrating a manufacturing method of a semiconductor package according to an embodiment of the disclosure.
Figure 1B:
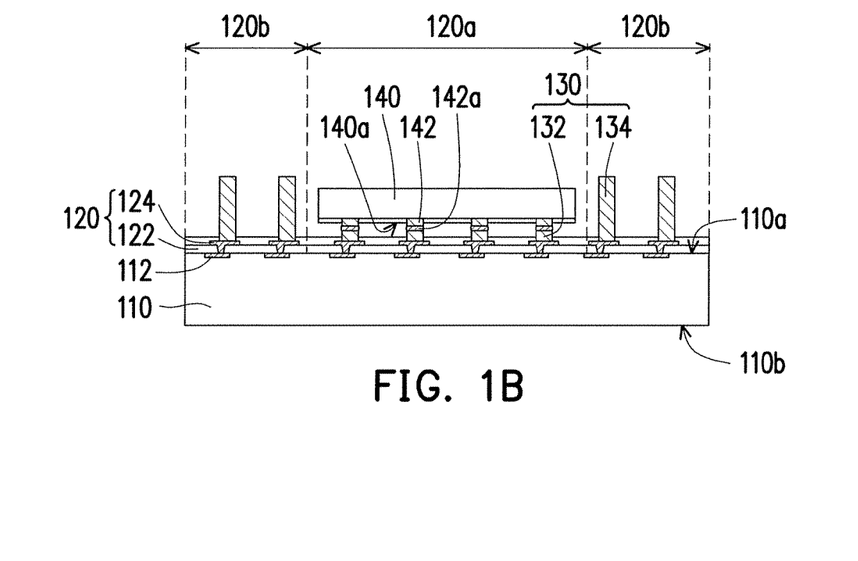
Figure 1C:
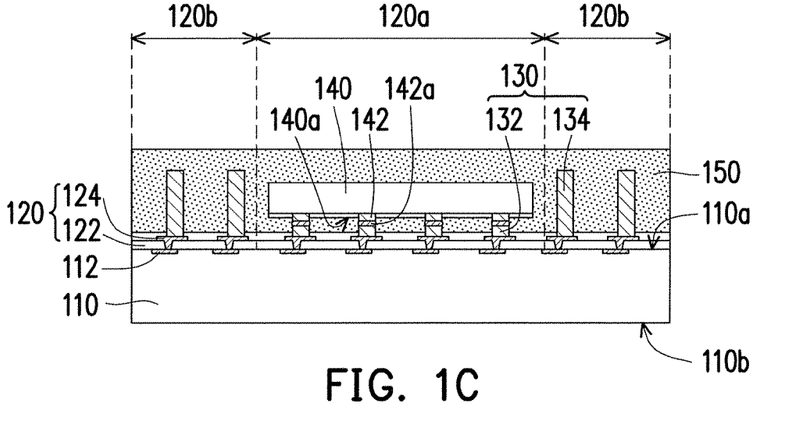

FIG. 1A to FIG. 1I are schematic cross-sectional views illustrating a manufacturing method of a semiconductor package according to an embodiment of the disclosure. A wafer including a plurality of first semiconductor dies 110 arranged in an array may be provided. It should be noted that for simplicity of illustration, single first semiconductor die 110 is shown in FIG. 1A to FIG. 1C, but the invention is not limited to. Referring to FIG. 1A, the first semiconductor die 110 may include a first active surface 110a, a first back surface 110b opposite to the first active surface 110a, and a plurality of conductive pads 112 on the first active surface 110a. In some embodiments, the first semiconductor die 110 may be an Application-Specific Integrated Circuit (BASIC). In some other embodiments, other suitable chips or active devices may be utilized as the first semiconductor die 110.

In some embodiments, a circuit layer 120 may be formed on the first active surface 110a of the first semiconductor die 110. The circuit layer 120 includes a first region 120a and a second region 120b connected to the first region 120. In some embodiments, the circuit layer 120 may be formed by a deposition process, a lithography process and an etching process, etc. For example, the circuit layer 120 may include a dielectric layer 122 and a patterned conductive layer 124 partially embedded in the dielectric layer 122. The patterned conductive layer 124 may be electrically connected to the conductive pads 112 of the first semiconductor die 110.

In some embodiments, a dielectric material may be formed over the first active surface 110a of the first semiconductor die 110. Next, the dielectric material may be patterned to form a plurality of openings. After patterning, the dielectric layer 122 is formed. For example, the openings 122a of the dielectric layer 122 corresponding to the conductive pads 112 of the first semiconductor die 110 may be formed using, for example, a photolithography (i.e., exposure and development processes), and an etching process. A material of the dielectric layer 122 may include inorganic or organic dielectric materials such as silicon oxide, silicon nitride, polyimide, benezocyclobutene (BCB), or the like. The patterned conductive layer 124 may be formed over the dielectric layer 122. For example, a conductive material, such as copper, aluminium, or nickel, may be formed in the openings 122a and on the dielectric layer 122 by a sputtering process, an evaporation process, or an electroplating process. The conductive material may be patterned by lithography and etching processes to form the patterned conductive layer 124. In some other embodiments, the patterned conductive layer 124 may be formed before the dielectric layer 122. The forming sequence of the dielectric layer 122 and the patterned conductive layer 124 may depend on the design requirement. In some embodiments, the forming process of the dielectric layer 122 and the patterned conductive layer 124 may be performed multiple times to obtain the circuit layer 120 with multi-layered as required by the circuit design. The topmost dielectric layer 122 may have openings 122a exposing at least the portion of the topmost patterned conductive layer 124 for further electrical connection. In some embodiments, the circuit layer 120 may be referred as the fan-in redistribution layer drawn into a region that overlaps with the first semiconductor die 110.

Subsequently, a plurality of conductive features 130 may be formed on the circuit layer 120 to electrically connect the patterned conductive layer 124. For example, the conductive features 130 may include a first coupling structure 132 formed corresponding to the first region 120a of the circuit layer 120 and a second coupling structure 134 formed corresponding to the second region 120b of the circuit layer 120. In other words, the second coupling structure 134 may be formed surrounding the first coupling structure 132. In some embodiments, the height of the second coupling structure 134 may be greater than the height of the first coupling structure 132. For instance, the first coupling structure 132 may include conductive bumps, solder bumps, or the like and the second coupling structure 134 may include conductive pillars, solder balls or the like.

For example, a patterned photoresist layer (not shown) having a predetermined pattern corresponding to the first region 120a may be formed over the circuit layer 120 through spin coating of a photoresist material layer, baking of the photoresist material layer, and photolithography (i.e. exposure and development processes). Portions of the patterned conductive layer 124 corresponding to the first region 120a may be exposed by the patterned photoresist layer. Subsequently, the first coupling structure 132 of the conductive features 130 may be formed using a plating process or other suitable process on the portions of the patterned conductive layer 124 corresponding to the first region 120a and exposed by the patterned photoresist layer. After the first coupling structure 132 of the conductive features 130 are formed, the patterned photoresist layer may be stripped using, for example, etching or other suitable removal processes.

Next, the second coupling structure 134 of the conductive features 130 may be formed on the circuit layer 120 corresponding to the second region 120b using similar processes used for forming the first coupling structure 132. Thus, the detailed descriptions are omitted herein for brevity. In some embodiments, the second coupling structure 134 may include a bottom part connected to the patterned conductive layer 124 and an extending part connected to the bottom part and extending towards a direction facing away the first active surface 110a. The bottom part of the second coupling structure 134 may be formed during forming the first coupling structure 132. For example, a patterned photoresist layer having a predetermined pattern corresponding to the first region 120a and the second region 120b may be formed over the circuit layer 120. Portions of the patterned conductive layer 124 corresponding to both of the first region 120a and the second region 120b may be exposed by the patterned photoresist layer. Subsequently, the first coupling structure 132 and the bottom part of the second coupling structure 134 may be formed on the patterned conductive layer 124 exposed by the patterned photoresist layer. After forming the first coupling structure 132 and the bottom part of the second coupling structure 134, another patterned photoresist layer may be formed to cover the first coupling structure 132. Subsequently, the extending part of the second coupling structure 134 may be formed on the bottom part by, for example, a plating process or other suitable process. As such, at least two different heights of the conductive features 130 may be formed on the circuit layer 120. In some other embodiments, the first coupling structure 132 may be formed first while the predetermined area for subsequently forming the second coupling structure 134 may be covered. After forming the first coupling structure 132, the second coupling structure 134 may be formed while the first coupling structure 132 may be covered. For example, forming the second coupling structure 134 may use the same process as forming the first coupling structure 132.

Referring to FIG. 1B, a second semiconductor die 140 is disposed on the first semiconductor die 110. In some embodiments, the size of the second semiconductor die 140 may be smaller than the size of the first semiconductor die 110. In other words, the second semiconductor die 140 may partially cover the first semiconductor die 110. The first semiconductor die 110 and the second semiconductor die 140 may provide the similar or different functions. In some embodiments, the second semiconductor die 140 may be disposed on the first coupling structure 132 of the conductive features 130 and electrically connected to the first semiconductor die 110 through the first coupling structure 132 of the conductive features 130 and the circuit layer 120. In some embodiments, the semiconductor die 140 may include a second active surface 140*a* and a plurality of conductive bumps 142 distributed at the second active surface 140*a*.

For example, the second active surface 140*a* may face towards the first active surface 110*a* of the first semiconductor die 110. In other words, the second semiconductor die 140 and the first semiconductor die 110 may be disposed in a face-to-face configuration. In some embodiments, before disposing the second semiconductor die 140, a plurality of bonding caps 142*a* may be formed on the conductive bumps 142 through a melting or reflow soldering process. For example, the bonding caps 142*a* may include a lead-free solder alloy or other suitable metal. In some embodiments, during disposing the second semiconductor die 140 on the first coupling structure 132 of the conductive features 130, a thermal energy and and/or a mechanical pressure may be applied to the bonding caps 142*a* for connecting the conductive bumps 142 to the first coupling structure 132 of the conductive features 130. In some embodiments, the bonding caps may be formed on the top surface of the first coupling structure 132 opposite to the circuit layer 120 before disposing the second semiconductor die 140. In some other embodiments, after disposing the second semiconductor die 140, the height of the second coupling structure 134 of the conductive features 130 may be greater than the thickness of the second semiconductor die 140 combining with the height of the first coupling structure 132 of the conductive features 130. In other words, a distance between a second back surface of the second semiconductor die 140 facing away the second active surface 140*a* and the topmost dielectric layer 122 is less than the height of the first coupling structure 132.

Figure 1D:
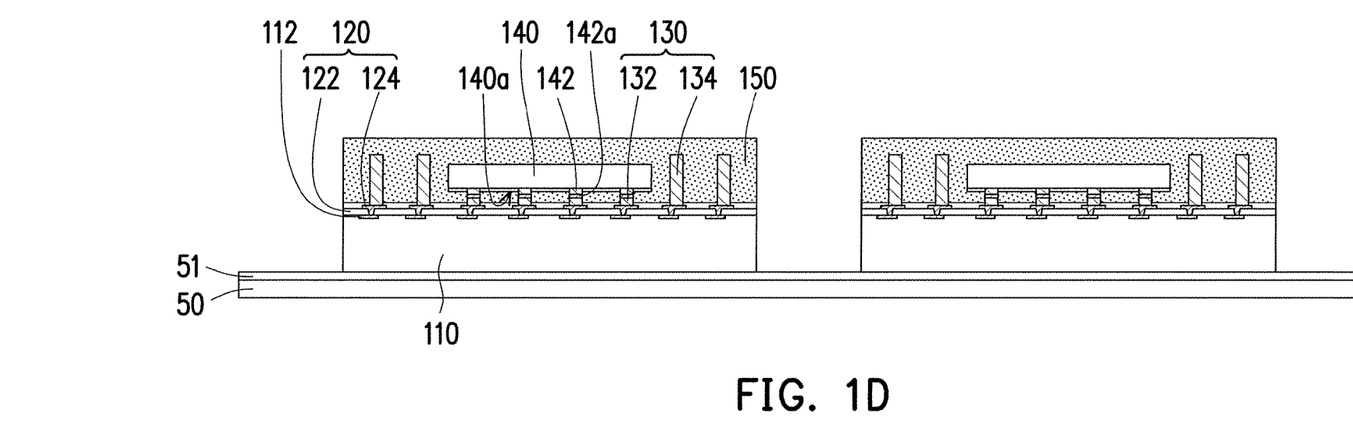

Referring to FIG. 1C and FIG. 1D, a first encapsulant 150 is formed on the circuit layer 120 to encapsulate the second semiconductor die 140 and the conductive features 130. The first encapsulant 150 may include a molding compound formed by a molding process (e.g., over-molding process). In some embodiments, the first encapsulant 150 may be formed by an insulating material such as epoxy or other suitable resins. For example, after forming the first encapsulant 150, a thickness of the first encapsulant 150 may be greater than the height of the second coupling structure 134 of the conductive features 130. In such case, the thickness of the first encapsulant 150 may be reduced after forming the first encapsulant 150 or at the subsequent process, which is described in the later embodiments accompany with FIG. 1F in details.

In some embodiments, after forming the first encapsulant 150, a dicing process may be performed to dice the wafer into a plurality of panel-level semi-products and a redistribution process may be followed by the dicing process. For example, the semi-products may be re-allocated to space apart the semi-products from one another for subsequent processes. In some embodiments, the panel-level semi-products may be disposed on a temporary carrier 50 as shown in FIG. 1D. For example, the temporary carrier 50 may be a panel-level carrier made of glass, plastic or other suitable materials as long as the material is able to withstand the subsequent processes while carrying the package structure formed thereon. In some embodiments, a de-bonding layer 51 may be disposed between the first back surface 110*b* of the first semiconductor die 110 and the temporary carrier 50 to enhance the releasability of the first semiconductor die 110 from the temporary carrier 50 in the subsequent processes. For example, the de-bonding layer 51 may be a LTHC (light to heat conversion) release layer or other suitable release layers.

Figure 1E:
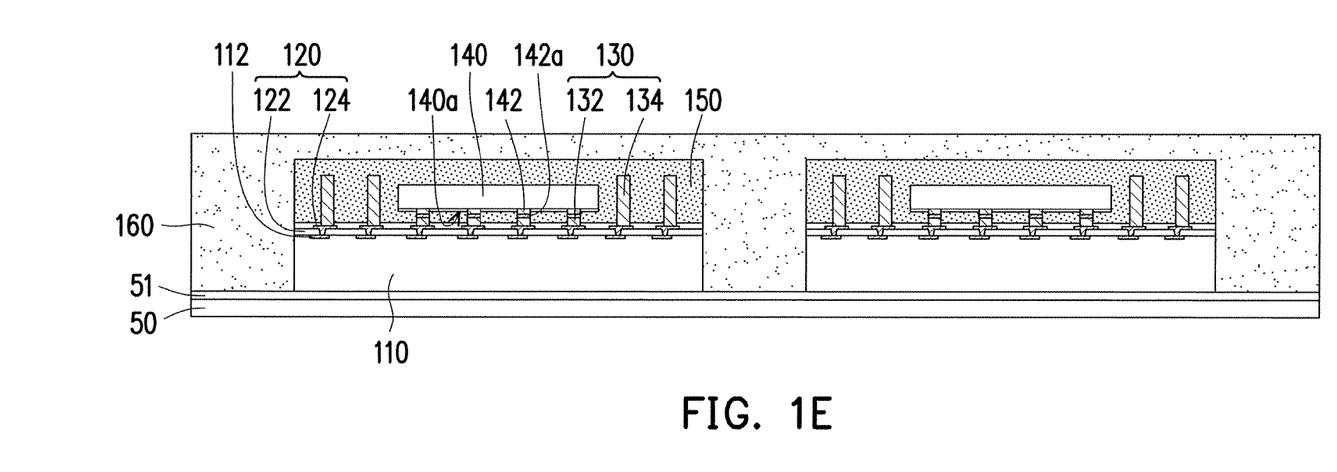
Figure 1F:
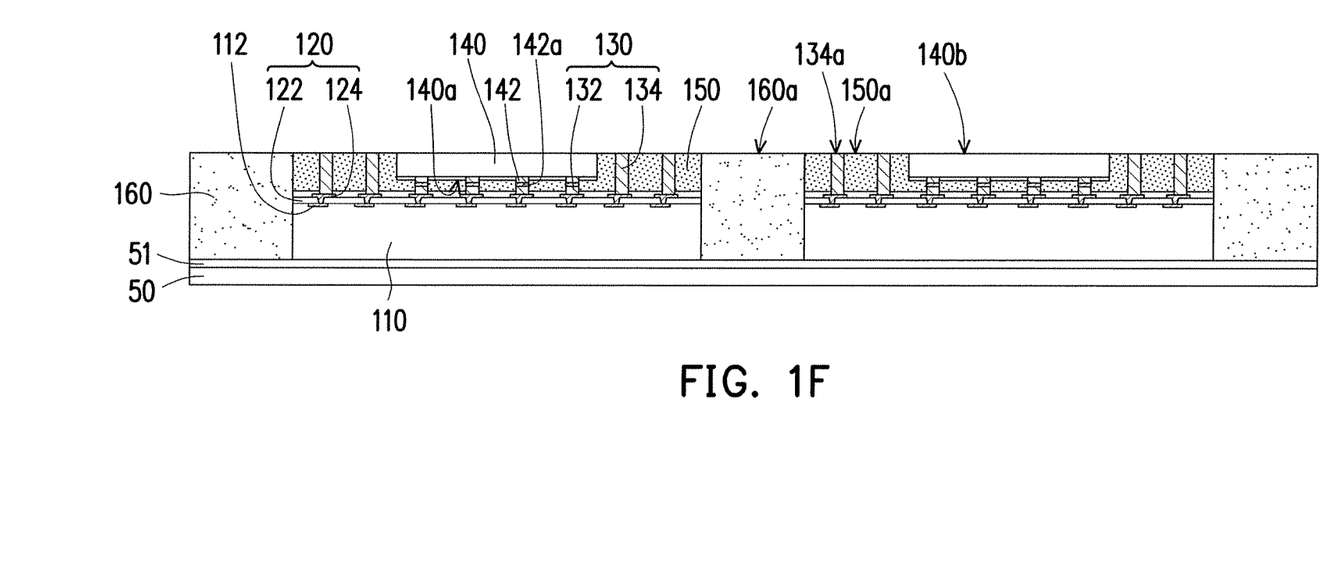

Referring to FIG. 1E and FIG. 1F, a second encapsulant 160 may be formed on the temporary carrier 50 to encapsulate the first encapsulant 150, the circuit layer 120, and the first semiconductor die 110. In some embodiments, the second encapsulant 160 may include a molding compound formed by a molding process (e.g., over-molding process). For example, the first encapsulant 150 may be formed in a wafer-level molding, while the second encapsulant 160 may be formed in a panel-level molding. In some embodiments, after forming the second encapsulant 160, the second coupling structure 134 of the conductive features 130 may be embedded in the first encapsulant 150 and covered by the second encapsulant 160. In such cases, the thickness of the second encapsulant 160 and the first encapsulant 150 may be reduced by a grinding process, an etching process, or other suitable process to expose at least a top surface 134*a* of the second coupling structure 134 of the conductive features 130. In some alternative embodiments, a portion of the bulk semiconductor material of the second semiconductor die 140 opposite to the second active surface 140*a* may be removed during the thickness reducing process. In such cases, the overall thickness of the second semiconductor die 140 may be reduced. For example, after reducing the thickness of the second encapsulant 160 and the first encapsulant 150, a second back surface 140*b* of the second semiconductor die 140 opposite to the second active surface 140 and the top surface 134*a* of the second coupling structure 134 of the conductive features 130 may be coplanar with the top surface 150*a* of the first encapsulant 150 and the top surface 160*a* of the second encapsulant 160. In other words, the second encapsulant 160 may laterally encapsulate the first encapsulant 150, the circuit layer 120 and the first semiconductor die 110.

Figure 1G:
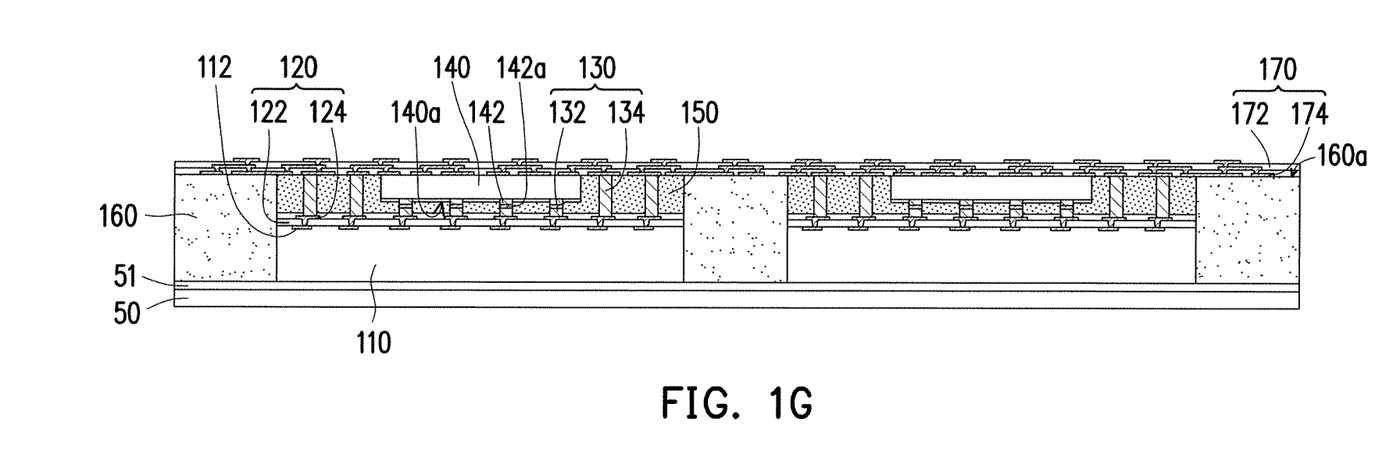

Referring to FIG. 1G, a redistribution layer 170 may be formed on the top surface 160*a* of the second encapsulant 160 and the top surface 150*a* of the first encapsulant 150. In some embodiments, the redistribution layer 170 including a dielectric layer 172 and a patterned conductive layer 174 partially embedded in the dielectric layer 172 formed by a deposition process, a lithography process, and an etching process, etc. The forming process of the redistribution layer 170 may be similar with the forming process of the circuit layer 120 and the detailed descriptions are omitted herein. In some embodiments, the topmost patterned dielectric layer 172 may have openings exposing at least the portion of the topmost patterned conductive layer 174. For example, the redistribution layer 170 may be electrically connected to the first semiconductor die 110 and the second semiconductor die 140 through the conductive features 130 and the circuit layer 120. In some other embodiments, a plurality of contact pads may be formed on the topmost of the patterned conductive layer 174 and the plurality of contact pads may be referred as under-ball metallurgy (UBM) patterns for a ball mounting process.

Figure 1H:
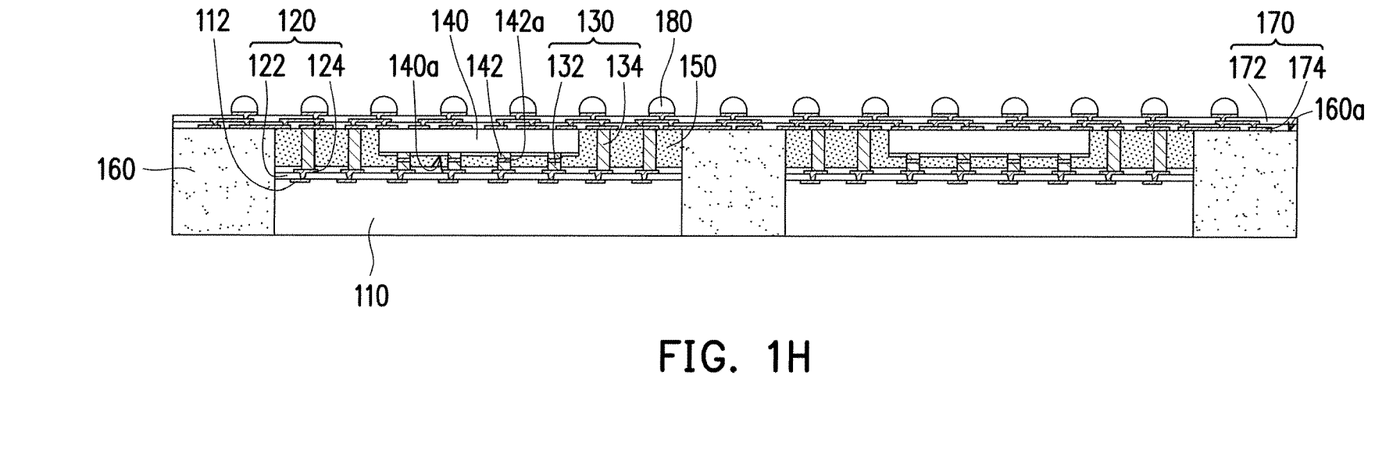

Referring to FIG. 1H, a plurality of conductive terminals 180 may be formed on the redistribution layer 170 opposite to the second encapsulant 160. For example, the conductive terminals 180 may include conductive balls, conductive pillars, conductive bumps or a combination thereof. The conductive terminals 180 may be formed by, for example, a ball mounting process, an electroless plating process or other suitable process. Other possible forms and shapes of the conductive terminals 180 may be utilized according to the design requirement. In some embodiments, a soldering process and a reflowing process are optionally performed for enhancement of the adhesion between the conductive terminals 180 and the redistribution layer 170. After forming the conductive terminals 180, the temporary carrier 50 may be removed from the first semiconductor die 110 and the second encapsulant 160. For example, the external energy such as UV laser, visible light or heat, may be applied to the de-bonding layer 51 so that the first semiconductor die 110 and the second encapsulant 160 may be peeled off from the temporary carrier 50.

Figure 1I:
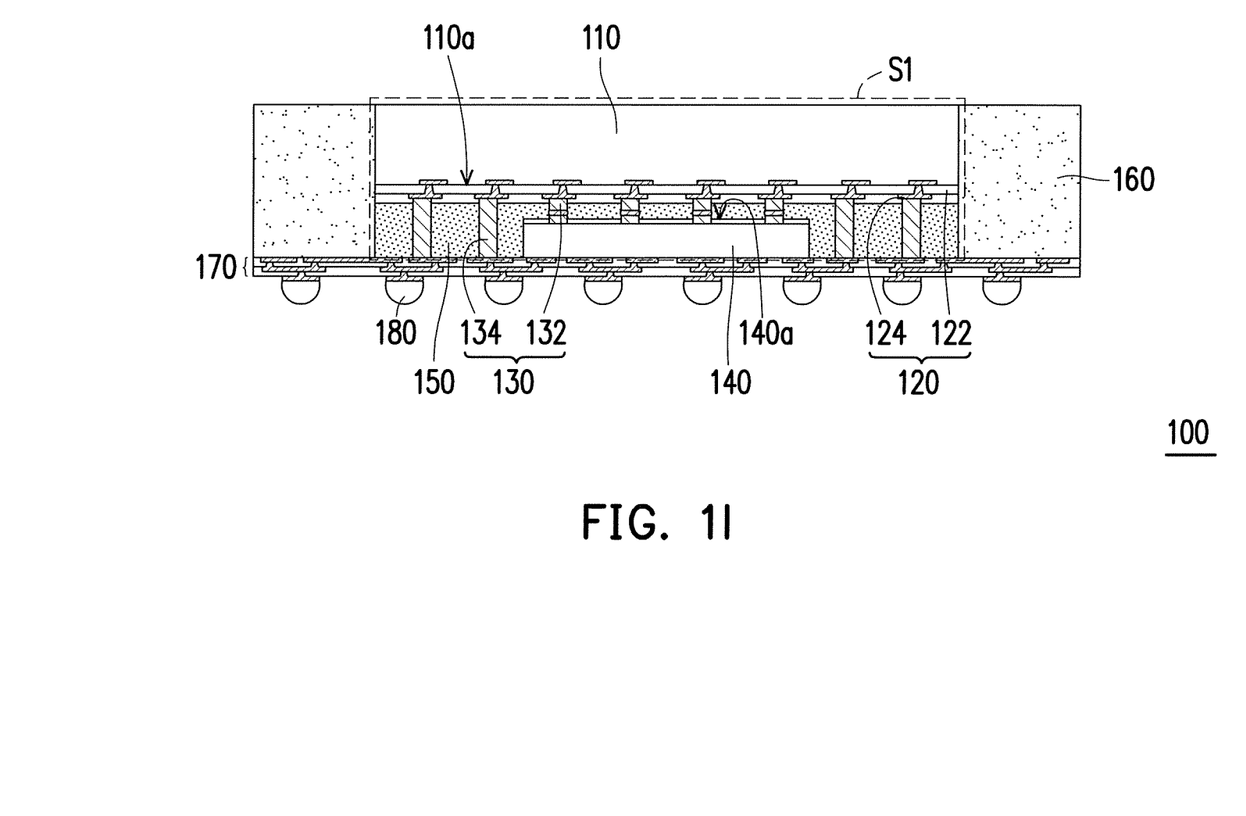

Subsequently, a singulation process may be performed and the manufacturing process of a semiconductor package 100 is substantially completed as shown in FIG. 1I. Each of the singulated semiconductor package 100 may include a stacked-die structure S1, the singulated second encapsulant 160 and the singulated redistribution layer 170. The stacked-die structure S1 may include the first semiconductor die 110, the circuit layer 120, the first coupling structure 132 of the conductive features 130, the second coupling structure 134 of the conductive features 130, the second semiconductor die 140, and the first encapsulant 150. The first active surface 110a of the first semiconductor die 110 and the second active surface 140a of the second semiconductor die 140 may be face to each other. The first back surface 110b of the first semiconductor die 110 may be coplanar with the surface of the second encapsulant 160 opposite to the redistribution layer 170. Since the first semiconductor die 110 and the second semiconductor die 140 are disposed in a face-to-face configuration, the signal transmission path may be shortened to improve the efficiency and enhance the integration. In addition, the second encapsulant 160 encapsulating the stacked-die structure S1 may provide the rigidity of the overall structure so as to prevent the semiconductor package 100 from being damaged.

Figure 2A:
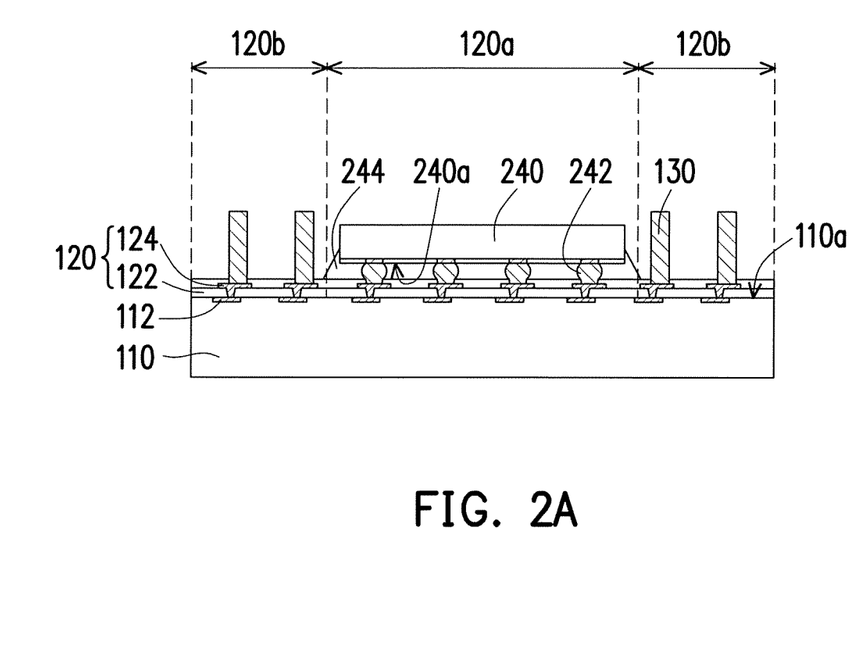
FIG. 2A and FIG. 2B are schematic cross-sectional views illustrating a manufacturing method of a semiconductor package according to an embodiment of the disclosure.
Figure 2B:
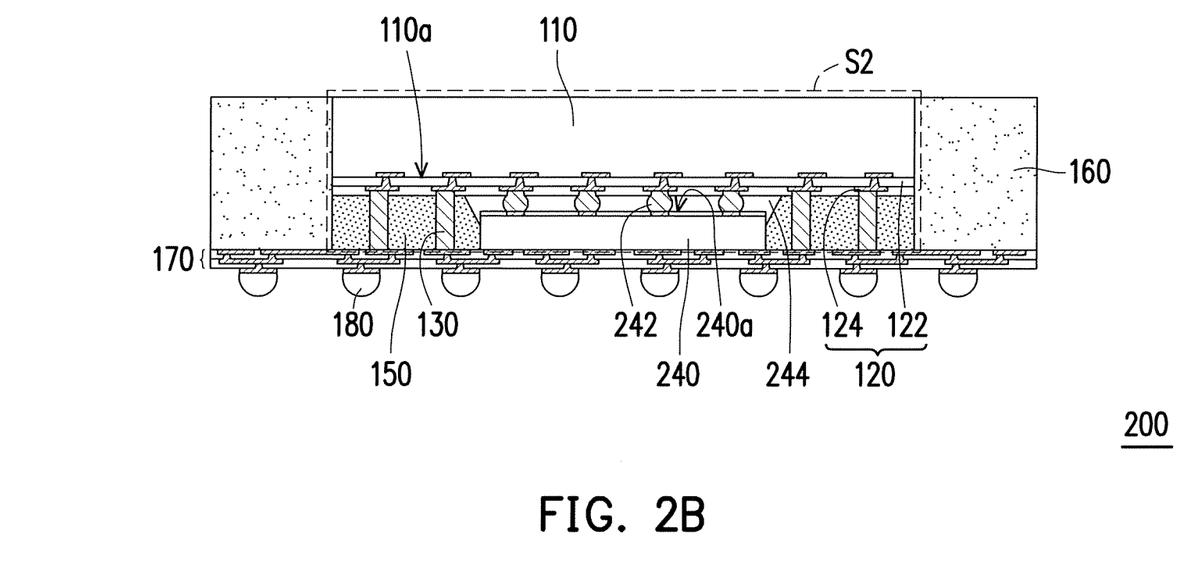

FIG. 2A and FIG. 2B are schematic cross-sectional views illustrating a manufacturing method of a semiconductor package according to an embodiment of the disclosure. The manufacturing method of the present embodiment is similar to the embodiment illustrated in FIG. 1A to FIG. 1I. The main difference is that the second semiconductor die 240 may be disposed on the circuit layer 120 through flip-chip bonding. In the present embodiment, a flip-chip technique is employed and the first semiconductor die 110 and the second semiconductor die 240 are electrically connected through conductive connectors 242.

Referring to FIG. 2A and FIG. 2B, a plurality of conductive features 230 may be formed on the circuit layer 120 corresponding to the second region 120b. The conductive features 230 are similar with the conductive features 130 shown in the embodiment illustrated in FIG. 1B. The difference between the present embodiment and the embodiment illustrated in FIG. 1B lies in that the conductive features 230 does not include the first coupling structure 132. After forming the conductive features 230, the second semiconductor die 240 may be disposed on the circuit layer 120 using the flip-chip technique. In some embodiments, the second semiconductor die 240 may include the second active surface 240a facing towards the first active surface 110a of the first semiconductor die 110 and a plurality of conductive connectors 242 distributed at the second active surface 240a to electrically connect the patterned conductive layer 124 of the circuit layer 120. In other words, the conductive connectors 242 of the second semiconductor die 240 are electrically connected to the first semiconductor die 110 through the circuit layer 120. For example, the conductive connectors 242 may include conductive pads (e.g., aluminum pads, copper pads or the like), conductive pillars (e.g. solder pillars, gold pillars, copper pillars or the like), conductive bumps (e.g., reflowed solder bumps, gold bumps, copper bumps or the like) or the combinations thereof. In some embodiments, an underfill 244 may be formed on the circuit layer 120 to mount the second semiconductor die 240 and reduce the strain on the conductive connectors 242. For instance, the underfill 244 may be injected or dispensed between the second semiconductor die 240 and the circuit layer 120 and may fill in a gap between the second active surface 240a of the second semiconductor die 240 and the circuit layer 120 to enhance the attachment therebetween. A material of the underfill 244 may include epoxy, silicone or the like. After disposing the second semiconductor die 240, the subsequent processes may be similar with the embodiments illustrated in FIG. 1C to FIG. 1I and the detailed descriptions are omitted herein. A semiconductor package 200 including a stacked-die structure S2, the second encapsulant 160 and the redistribution layer 170 is provided as shown in FIG. 2B.

Figure 3A:
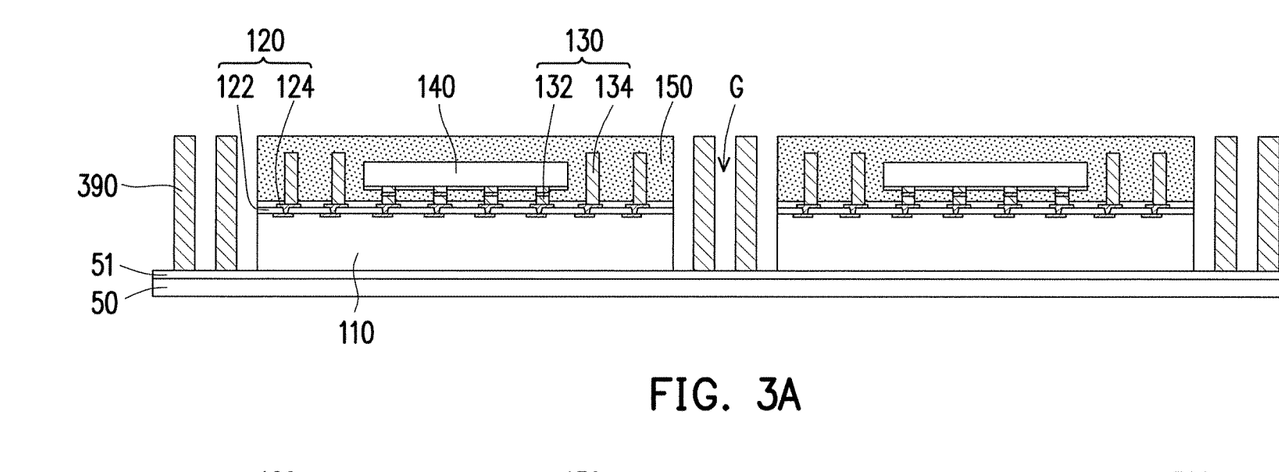
FIG. 3A to FIG. 3D are schematic cross-sectional views illustrating a manufacturing method of a package-on-package structure according to an embodiment of the disclosure.

FIG. 3A to FIG. 3D are schematic cross-sectional views illustrating a manufacturing method of a package-on-package structure according to an embodiment of the disclosure. Some of manufacturing processes of the present embodiment are similar with the embodiments illustrated in FIG. 1A to FIG. 1D and the detailed descriptions are omitted. After redistributing the semi-products on the temporary carrier 50 as illustrated in FIG. 1D, a gap may be formed between the two adjacent semi-products. Referring to FIG. 3A, a plurality of conductive elements 390 may be formed on the temporary carrier 50 corresponding to the gap G between the two adjacent semi-products. In other words, the conductive elements 390 are formed surrounding the first semiconductor die 110 for further electrical connection. For example, the conductive elements 390 may include conductive pillars, conductive balls or combination thereof formed by a plating process, a deposition process, a ball mounting process or other suitable process.

Figure 3B:
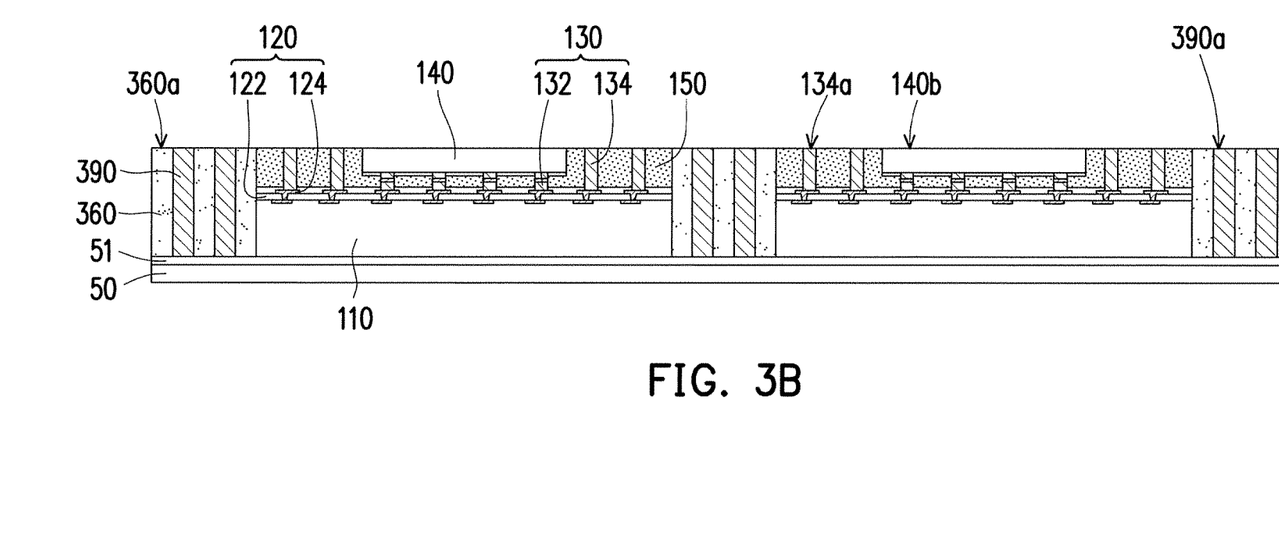

Referring to FIG. 3B, after forming the conductive elements 390, the second encapsulant 360 may be formed on the temporary carrier 50 to encapsulate the first encapsulant 150, the circuit layer 120, the first semiconductor die 110 and the conductive elements 390. The material and the forming process of the second encapsulant 360 may be similar with the second encapsulant 160 as described in FIG. 1E and the detailed descriptions are omitted herein. In some embodiments, after forming the second encapsulant 360, the conductive elements 390 may be embedded in the second encapsulant 360. In such cases, the thickness of the second encapsulant 360 may be reduced to expose at least a top surface 390a of the conductive elements 390. The process of reducing thickness of the second encapsulant 360 may be similar as described in FIG. 1F and the detailed descriptions are omitted. After reducing the thickness of the second encapsulant 360, a second back surface 140b of the second semiconductor die 140, the top surface 134a of the second coupling structure 134 of the conductive features 130, the top surface 150a of the first encapsulant 150 may be coplanar with the top surface 390a of the conductive elements 390 and the top surface 360a of the second encapsulant 360. In other words, the second encapsulant 160 may laterally encapsulate the first encapsulant 150, the circuit layer 120, the first semiconductor die 110 and the conductive elements 390.

Figure 3C:
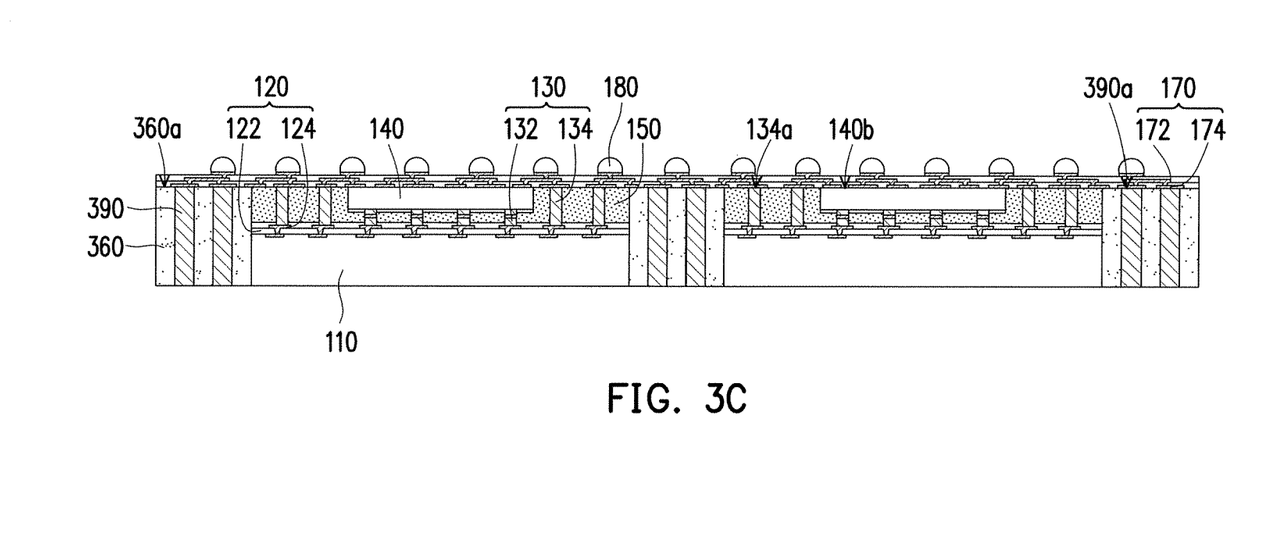

Referring to FIG. 3C, the redistribution layer 170 may be formed on the second encapsulant 360. For example, the patterned conductive layer 174 of the redistribution layer 170 may be electrically connected to the conductive elements 390 and the conductive features 130. In other words, the conductive elements 390 may be electrically connected to the first semiconductor die 110 and the second semiconductor die 140 through the redistribution layer 170 and the conductive features 130. Next, the conductive terminals 180 may be formed on the redistribution layer 170. After forming the conductive terminals 180, the temporary carrier 50 may be removed. The processes of forming the redistribution layer 170 and the conductive terminals 180 may be similar as described in FIG. 1G and FIG. 1H and the detailed descriptions are omitted herein.

Figure 3D:
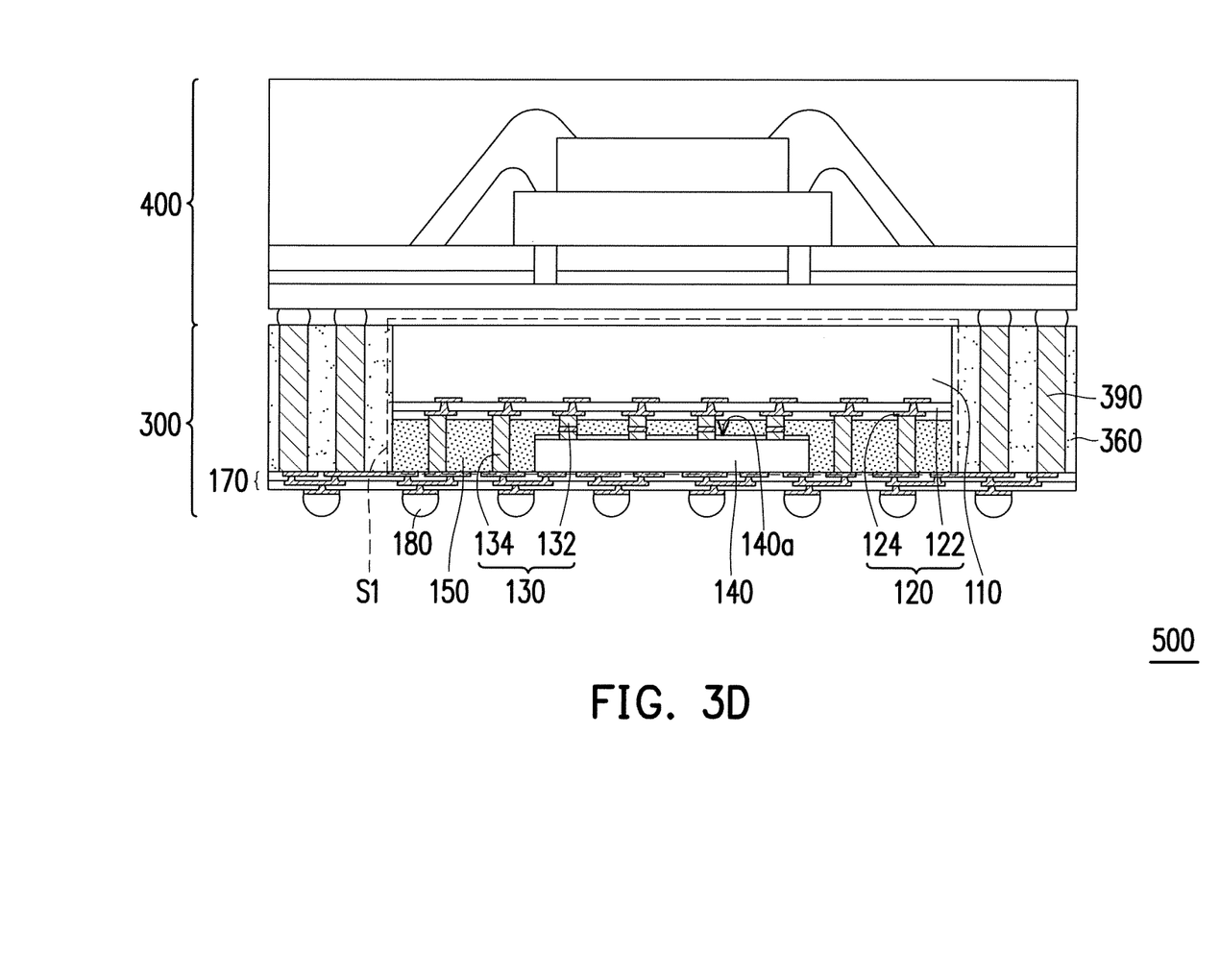

Referring to FIG. 3D, after removing the temporary carrier 50, the singulation process may be performed and the manufacturing process of a semiconductor package 300 may be substantially completed. After forming the semiconductor package 300, a semiconductor device 400 may be disposed on the semiconductor package 300 to form a package-on-package (POP) structure 500. For example, the semiconductor device 400 may be electrically connected to the semiconductor package 300 through the conductive elements 390. In some embodiments, the semiconductor device 400 may include DRAM, NAND flash memory or other memory devices. Other active devices may be included in the semiconductor device 400, which construes no limitation in the disclosure. In other words, multiple integrated circuit packages may be stacked upon one another to provide additional functionality in the POP structure P. As such, the semiconductor package 300 may be referred to a fan-out package structure in which the rerouting conductive path connected to the first semiconductor die 110 are rearranged to expand wider than the size of the first semiconductor die 110. In some embodiments, the stacked-die structure S1 may be referred to a fan-in package structure in which the rerouting conductive path connected to the first semiconductor die 110 are rearranged within the size range of the first semiconductor die 110. As a result, the semiconductor package 300 including the fan-in and the fan-out package structures may open the possibility to various POP structure designs.

Figure 4A:
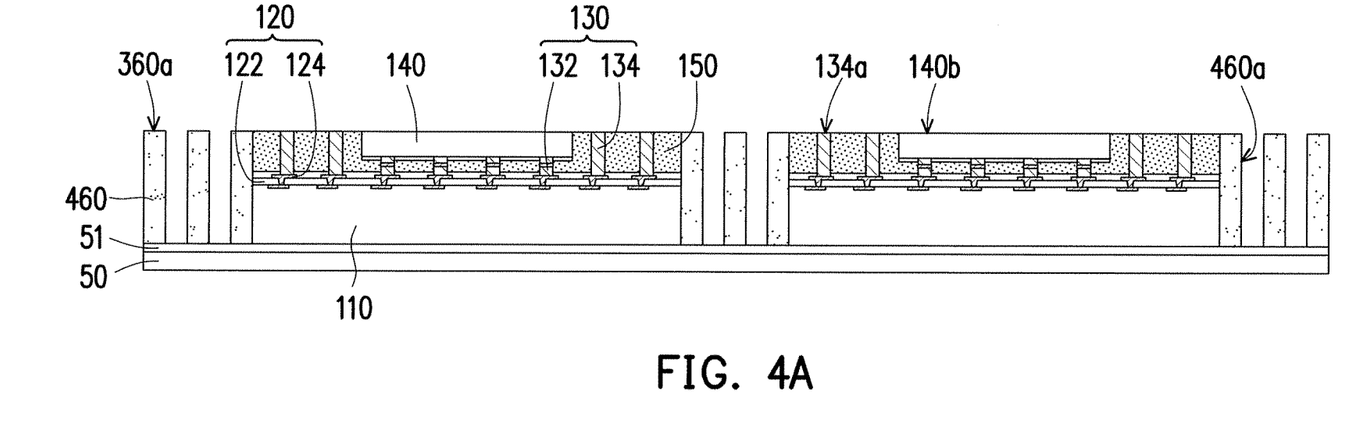
FIG. 4A and FIG. 4B are schematic cross-sectional views illustrating a manufacturing method of a semiconductor package according to an embodiment of the disclosure.
Figure 4B:
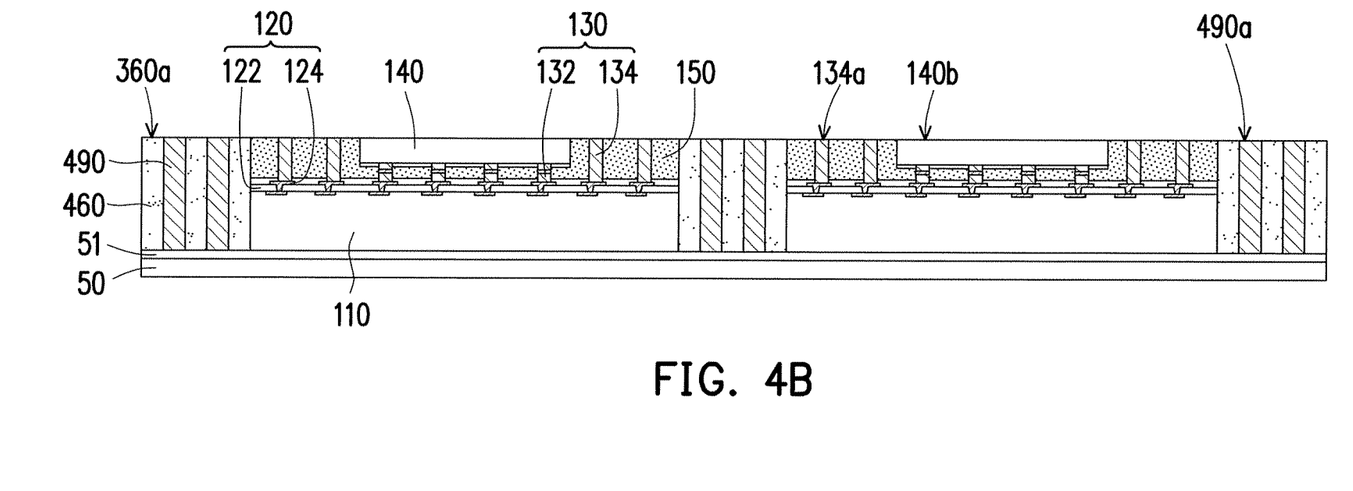

FIG. 4A and FIG. 4B are schematic cross-sectional views illustrating a manufacturing method of a semiconductor package according to an embodiment of the disclosure. The manufacturing method of the present embodiment is similar with the embodiments illustrated in FIG. 3A to FIG. 3D. The difference lies in that the second encapsulant 460 may be formed before the conductive elements 490.

Referring to FIG. 4A and FIG. 4B, the second encapsulant 460 is formed on the temporary carrier 50 and the top surface 134a of the second coupling structure 134 of the conductive features 130 are exposed by the first encapsulant 150 and the second encapsulant 160 as shown in FIG. 1F. Subsequently, a plurality of openings 460a may be formed on the second encapsulant 460 surrounding the first semiconductor die 110 by, for example, a drilling process or other suitable process. Next, the conductive elements 490 may be formed corresponding to the openings 460a of the second encapsulant 460. In some embodiments the conductive elements 490 may be referred as the through molding vias. After forming the conductive elements 490, the subsequent processes may be similar with the processes illustrated in FIG. 3C and FIG. 3D and the detailed descriptions are omitted herein.

Based on the above, the semiconductor package including the stacked-die structure may provide multi-functions in a single package to reduce the fabrication cost and the packaging volume. Moreover, since the first semiconductor die and the second semiconductor die are disposed in a face-to-face configuration, the signal transmission path is shortened to improve the efficiency and the integration is greatly enhanced. In addition, the first encapsulant and the second encapsulant may provide the rigidity of the overall structure so as to prevent the semiconductor package from being damaged. Furthermore, multiple integrated circuit packages may be stacked upon one another to provide additional functionality in the POP structure. In addition, the semiconductor package including the fan-in structure and the fan-out structure may open the possibility to various POP structure designs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A semiconductor package, comprising:
a stacked-die structure comprising:
a first semiconductor die comprising a first active surface;
a circuit layer disposed on and not extending laterally beyond the first active surface of the first semiconductor die;
a second semiconductor die electrically connected to the first semiconductor die through the circuit layer and comprising a second active surface facing towards the first active surface of the first semiconductor die;
a plurality of conductive features disposed on the circuit layer and the first semiconductor die and electrically connected to the first semiconductor die and the second semiconductor die, wherein
a portion of the plurality of conductive features laterally surrounds the second semiconductor die, and
the plurality of conductive features comprise a first coupling structure disposed between the first semiconductor die and the second semiconductor die and a second coupling structure surrounding the first coupling structure; and
a first encapsulant encapsulating the second semiconductor die and the plurality of conductive features;
a second encapsulant laterally encapsulating the stacked-die structure, wherein a second back surface of the second semiconductor die opposite to the second active surface and a top surface of the second coupling structure are coplanar with a top surface of the first encapsulant and a top surface of the second encapsulant; and
a redistribution layer disposed on the second encapsulant and the staked-die structure, wherein
the redistribution layer is electrically connected to the staked-die structure, and
the second coupling structure is electrically connected to the first semiconductor die and the redistribution layer.
2. The semiconductor package according to claim 1, further comprising:

a plurality of conductive terminals disposed on the redistribution layer opposite to the second encapsulant and the stacked-die structure, wherein the plurality of conductive terminals are electrically connected to the stacked-die structure through the redistribution layer.

3. The semiconductor package according to claim 1, wherein a height of the second coupling structure of the plurality of conductive features is greater than a height of the first coupling structure of the plurality of conductive features.

4. The semiconductor package according to claim 1, wherein the second semiconductor die comprises a plurality of conductive bumps distributed at the second active surface, the plurality of conductive bumps are electrically connected to the first coupling structure of the plurality of conductive features.

5. The semiconductor package according to claim 1, further comprising:
a plurality of conductive elements surrounding the stacked-die structure and electrically connected to the redistribution layer, wherein the plurality of conductive elements are embedded in the second encapsulant and a portion of the plurality of conductive elements are exposed by the second encapsulant.

6. The semiconductor package according to claim 5, further comprising:
a semiconductor device disposed on the second encapsulant and the stacked-die structure opposite to the redistribution layer, wherein the semiconductor device is electrically connected to the stacked-die structure though the plurality of conductive elements and the redistribution layer.

7. A semiconductor package, comprising:
a first semiconductor die comprising a first active surface;
a second semiconductor die electrically connected to the first semiconductor die and comprising a second active surface facing towards the first active surface of the first semiconductor die, wherein the second semiconductor die partially covers the first semiconductor die;
a plurality of conductive features disposed over the first active surface of the first semiconductor die and electrically connected to the first semiconductor die and the second semiconductor die, wherein
a portion of the plurality of conductive features laterally surrounds the second semiconductor die,
the plurality of conductive features comprise a first coupling structure corresponding to the second semiconductor die and a second coupling structure surrounding the first coupling structure, and
a height of the second coupling structure is greater than a height of the first coupling structure;
a first encapsulant encapsulating the second semiconductor die and the plurality of conductive features;
a second encapsulant laterally encapsulating the first encapsulant and the first semiconductor die, wherein a second back surface of the second semiconductor die opposite to the second active surface and a top surface of the second coupling structure are coplanar with a top surface of the first encapsulant and a top surface of the second encapsulant; and
a redistribution layer disposed on the second encapsulant and the first encapsulant, wherein the redistribution layer is electrically connected to the first semiconductor die and the second semiconductor die through the plurality of conductive features.

8. The semiconductor package according to claim 7, further comprising:
a plurality of conductive terminals disposed on the redistribution layer opposite to the second encapsulant, wherein the plurality of conductive terminals are electrically connected to the redistribution layer.

9. The semiconductor package according to claim 7, wherein the second semiconductor die comprises a plurality of conductive bumps distributed at the second active surface, and the plurality of conductive bumps are electrically connected to the first coupling structure of the plurality of conductive features.

\* \* \* \* \*